(12) United States Patent
Jin et al.

(10) Patent No.: US 12,500,161 B2
(45) Date of Patent: Dec. 16, 2025

(54) FUNCTIONAL COMPONENT, FORMING METHOD THEREOF AND ELECTRONIC DEVICE

(71) Applicant: Shanghai AVIC OPTO Electronics Co., Ltd., Shanghai (CN)

(72) Inventors: Huijun Jin, Shanghai (CN); Zhen Liu, Shanghai (CN); Mingyu Wang, Shanghai (CN)

(73) Assignee: Shanghai AVIC OPTO Electronics Co., Ltd., Shanghai (CN)

( * ) Notice: Subject to any disclaimer, the term of this patent is extended or adjusted under 35 U.S.C. 154(b) by 271 days.

(21) Appl. No.: 18/491,406

(22) Filed: Oct. 20, 2023

(65) Prior Publication Data

US 2025/0046699 A1    Feb. 6, 2025

(30) Foreign Application Priority Data

Jul. 31, 2023    (CN) .......................... 202310954951.1

(51) Int. Cl.
    *H01L 23/498*      (2006.01)
    *H01L 21/48*       (2006.01)
    *H01L 23/00*       (2006.01)

(52) U.S. Cl.
CPC .... *H01L 23/49838* (2013.01); *H01L 21/4853* (2013.01); *H01L 23/49811* (2013.01); *H01L 24/05* (2013.01); *H01L 24/45* (2013.01); *H01L 24/48* (2013.01); *H01L 2224/05553* (2013.01); *H01L 2224/05557* (2013.01); *H01L 2224/05558* (2013.01); *H01L 2224/05567* (2013.01); *H01L 2224/05572* (2013.01); *H01L 2224/05573* (2013.01); *H01L 2224/05624* (2013.01); *H01L 2224/45144* (2013.01); *H01L 2224/48221* (2013.01); *H01L 2224/48463* (2013.01); *H01L 2224/48476* (2013.01)

(58) Field of Classification Search
CPC . H01L 23/498; H01L 21/48; H01L 23/49838; H01L 24/05; H01L 24/48; H01L 21/4853; H01L 24/45
USPC ........................................................ 174/257
See application file for complete search history.

(56) References Cited

FOREIGN PATENT DOCUMENTS

CN        104049398 A     9/2014

*Primary Examiner* — Tremesha W Burns
(74) *Attorney, Agent, or Firm* — Anova Law Group, PLLC

(57) ABSTRACT

Functional component, forming method thereof and electronic device are provided. The functional component includes a packaging substrate and a connecting wire. The packaging substrate includes a through-hole wire-bonding area including a first insulating layer and a wire-bonding electrode sequentially formed on the substrate. The first insulating layer includes a first through hole, and the wire-bonding electrode covers the first through hole. In an area corresponding to the first through hole, the packaging substrate has wire-bonding bump electrodes on a side of the wire-bonding electrode away from the first insulating layer. The connecting wire includes a wire-bonding connection portion and a wire-bonding extension portion connected to the wire-bonding connection portion. The wire-bonding connection portion is fixedly connected to the wire-bonding electrode. The wire-bonding connection portion extends to cover at least a partial area of a side of at least one of the wire-bonding bump electrodes.

16 Claims, 11 Drawing Sheets

FUNCTIONAL COMPONENT, FORMING METHOD THEREOF AND ELECTRONIC DEVICE

CROSS-REFERENCE TO RELATED APPLICATION

This application claims priority of Chinese Patent Application No. 202310954951.1, filed on Jul. 31, 2023, the entire contents of which are hereby incorporated by reference.

FIELD OF THE DISCLOSURE

The present disclosure generally relates to the field of device packaging technology and, more particularly, relates to a functional component, a forming method thereof, and an electronic device.

BACKGROUND

For packaging a device, electrically connecting electrodes at a through hole on the device with other electronic components is often conducted by wire bonding. However, at present, it is easy to fail when bonding connecting wires and the electrodes at the through hole.

BRIEF SUMMARY OF THE DISCLOSURE

One aspect of the present disclosure provides a functional component. The functional component includes a packaging substrate and a connecting wire. The packaging substrate includes a through-hole wire-bonding area including a first insulating layer and a wire-bonding electrode sequentially formed on the substrate. The first insulating layer includes a first through hole, and the wire-bonding electrode covers the first through hole. In an area corresponding to the first through hole, the packaging substrate has wire-bonding bump electrodes on a side of the wire-bonding electrode away from the first insulating layer. The connecting wire includes a wire-bonding connection portion and a wire-bonding extension portion connected to the wire-bonding connection portion. The wire-bonding connection portion is fixedly connected to the wire-bonding electrode. The wire-bonding connection portion extends to cover at least a partial area of a side of at least one of the wire-bonding bump electrodes.

Another aspect of the present disclosure provides an electronic device including a functional component. The functional component includes a packaging substrate and a connecting wire. The packaging substrate includes a through-hole wire-bonding area including a first insulating layer and a wire-bonding electrode sequentially formed on the substrate. The first insulating layer includes a first through hole, and the wire-bonding electrode covers the first through hole. In an area corresponding to the first through hole, the packaging substrate has wire-bonding bump electrodes on a side of the wire-bonding electrode away from the first insulating layer. The connecting wire includes a wire-bonding connection portion and a wire-bonding extension portion connected to the wire-bonding connection portion. The wire-bonding connection portion is fixedly connected to the wire-bonding electrode. The wire-bonding connection portion extends to cover at least a partial area of a side of at least one of the wire-bonding bump electrodes.

Another aspect of the present disclosure provides a forming method of a functional component. The functional component includes a packaging substrate and a connecting wire. The packaging substrate includes a through-hole wire-bonding area including a first insulating layer and a wire-bonding electrode sequentially formed on the substrate. The first insulating layer includes a first through hole, and the wire-bonding electrode covers the first through hole. In an area corresponding to the first through hole, the packaging substrate has wire-bonding bump electrodes on a side of the wire-bonding electrode away from the first insulating layer. The connecting wire includes a wire-bonding connection portion and a wire-bonding extension portion connected to the wire-bonding connection portion. The wire-bonding connection portion is fixedly connected to the wire-bonding electrode. The wire-bonding connection portion extends to cover at least a partial area of a side of at least one of the wire-bonding bump electrodes.

Other aspects of the present disclosure can be understood by a person skilled in the art in light of the description, the claims, and the drawings of the present disclosure.

BRIEF DESCRIPTION OF THE DRAWINGS

To illustrate technical solutions of embodiments of the present disclosure or the prior art more clearly, accompanying drawings required to describe the embodiments are briefly introduced below. Obviously, the accompanying drawings in the following description are only the embodiments of the present disclosure. A person skilled in the art can obtain other drawings according to the accompanying drawings without creative efforts.

DETAILED DESCRIPTION

Figure 1:
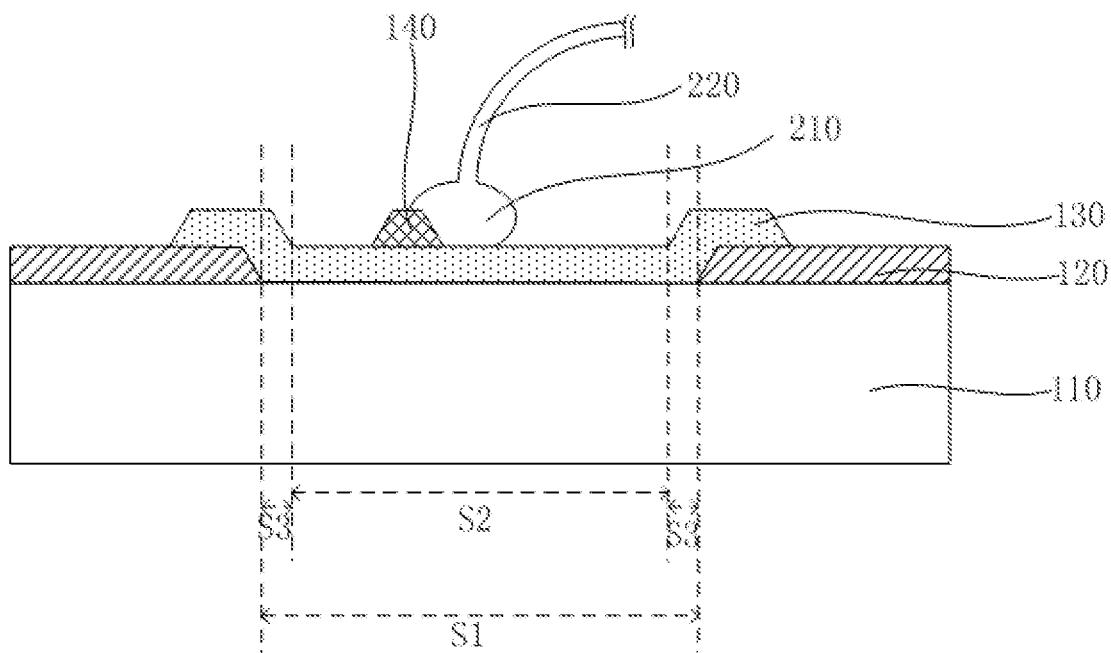
FIG. 1 illustrates a schematic diagram of a functional component consistent with various embodiments of the present disclosure.

The following will clearly and completely describe the technical solutions in the embodiments of the present disclosure with reference to the accompanying drawings in the embodiments of the present disclosure. Obviously, the described embodiments are only some but not all the embodiments of the present disclosure. Based on the embodiments of the present disclosure, all other embodiments obtained by a person skilled in the art without making creative efforts belong to the protection scope of the present disclosure.

As described in the background, at present, it is easy to fail when bonding connecting wires and electrodes at through holes, which not only reduces a success rate of bonding, but also cannot flexibly select a bonding position.

At a flat area in a corresponding through hole of an electrode, a new black film material is produced on a surface of the electrode. The new black film material may be a mixture of electrode oxide and other substances. After the black film is removed, a connecting wire can be successfully bonded in the flat area of the electrode. Therefore, the black film material hinders a fixed connection between the electrode and the connecting wire, which leads to a failure of a wire bonding between the connecting wire and the electrode. Most of successfully bonded products have a connecting wire and an electrode overlapping at an edge of a through hole. The electrode also has a black film material created at the edge of the through hole. However, during a wire bonding process of the connecting wire, the black film material of the electrode at the edge of the through hole falls off, so that the connecting wire can be successfully bonded with the electrode at the edge of the through hole. However, it is difficult for a current device to accurately locate the position of the electrode at the edge of the through hole. When positioning the through hole, most of a positioning area is a flat area in a center of an electrode corresponding to a through hole. When an area of the through hole is larger, there is a higher probability of localization to the flat area of the electrode.

A plurality of wire-bonding bump electrodes is arranged on the flat area of the electrode, so that when bonding the connecting wire and the electrode, black film material formed on the wire-bonding bump electrodes and the surface of the electrode falls off, which can not only improve a success rate of wire bonding, but also improve a flexibility of wiring. Based on the above, the embodiments of the present disclosure provide a functional component and a forming method thereof and an electronic device, which can effectively solve the existing technical problem, and can realize a successful bonding between an electrode and a connecting wire in an area corresponding to a through hole, which only improves a success rate of wire bonding, but also improves a flexibility of wire bonding in forming a functional component.

To achieve the above purpose, the technical solutions provided by the embodiments of the present disclosure are as follows, and the technical solutions provided by the embodiments of the present disclosure will be described in detail with reference to FIG. 1 to FIG. 19.

FIG. 1 illustrates a schematic diagram of a functional component consistent with various embodiments of the present disclosure. The functional component includes a packaging substrate and a connecting wire. The packaging substrate includes a through-hole wire-bonding area, and the through-hole wire-bonding area includes a first insulating layer 120 and a wire-bonding electrode 130 sequentially formed on a substrate 110. The first insulating layer 120 includes a first through hole S1, and the wire-bonding electrode 130 covers the first through hole S1. In an area corresponding to the first through hole S1, the packaging substrate 100 has wire-bonding bump electrodes 140 on a side of the wire-bonding electrode 130 away from the first insulating layer 120.

The connecting wire includes a wire-bonding connection portion 210 and a wire-bonding extension portion 220 connected to the wire-bonding connection portion 210. The wire-bonding connection portion 210 is fixedly connected to the wire-bonding electrode 130, and the wire-bonding connection portion 210 extends to cover at least a partial area of a side of at least one of the wire-bonding bump electrodes 140.

As shown in FIG. 1, in one embodiment, a connecting position of the wire-bonding electrode 130 and the wire-bonding connection portion 210 is in the area corresponding to the first through hole S1. That is, the area corresponding to the first through hole S1 is the middle area S2 except an edge area S3 of the first through hole S1. Therefore, there is no need to limit the connecting position of the wire-bonding connection portion 210 and the wire-bonding electrode 130 to a protrusion where the wire-bonding electrode 130 covers the edge area S3 of the first through hole S1, which not only improves a success rate of wire bonding, but also improves a flexibility of the wire bonding process. The substrate 110 can be a glass substrate, a circuit substrate, or the like, which is not specifically limited herein.

In one embodiment, the functional component can be a semiconductor device, or other circuit device to be packaged. The wire-bonding electrode 130 is electrically connected to some electronic components by wire bonding. The electronic components can be passive components such as capacitors, inductors, and resistors, or some active components, which are not specifically limited herein.

It can be understood that, in the embodiment, in the area corresponding to the first through hole S1, the packaging substrate has the wire-bonding bump electrodes 140 on the side of the wire-bonding electrode 130 away from the first insulating layer 120. Therefore, the wire-bonding connection portion 210 connected to the wire is fixedly connected to the wire-bonding electrode 130 at the wire-bonding bump electrodes 140, and the wire-bonding connection portion 210 covers at least a partial area of at least one wire-bonding bump electrode 140, which can ensure that the wire bonding between the wire-bonding electrode 130 and the connecting wire is successful. The embodiment can achieve a successful bonding between the wire-bonding electrode 130 and the connecting wire in the area corresponding to the first through hole S1, which not only improves a success rate of wire bonding, but also improves a flexibility of wire bonding in a forming process of the functional component.

Figure 2:
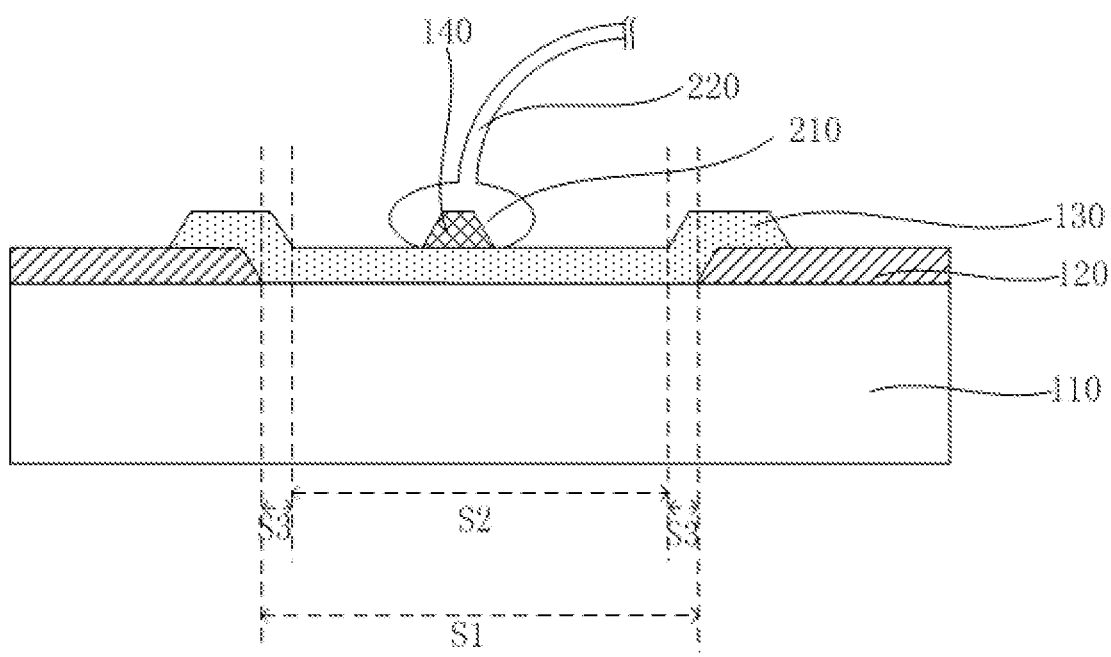
FIG. 2 illustrates a schematic diagram of another functional component consistent with various embodiments of the present disclosure.

As shown in FIG. 1, the wire-bonding connection portion 210 may cover a partial area of a side of a wire-bonding bump electrode 140. In other embodiments, the wire-bonding connection portion can also be covered with the wire-bonding bump electrode in other ways. Specifically, FIG. 2 illustrates a schematic diagram of another functional component consistent with various embodiments of the present disclosure. The wire-bonding connection portion 210 covers an entire area of one wire-bonding bump electrode 140.

Figure 3:
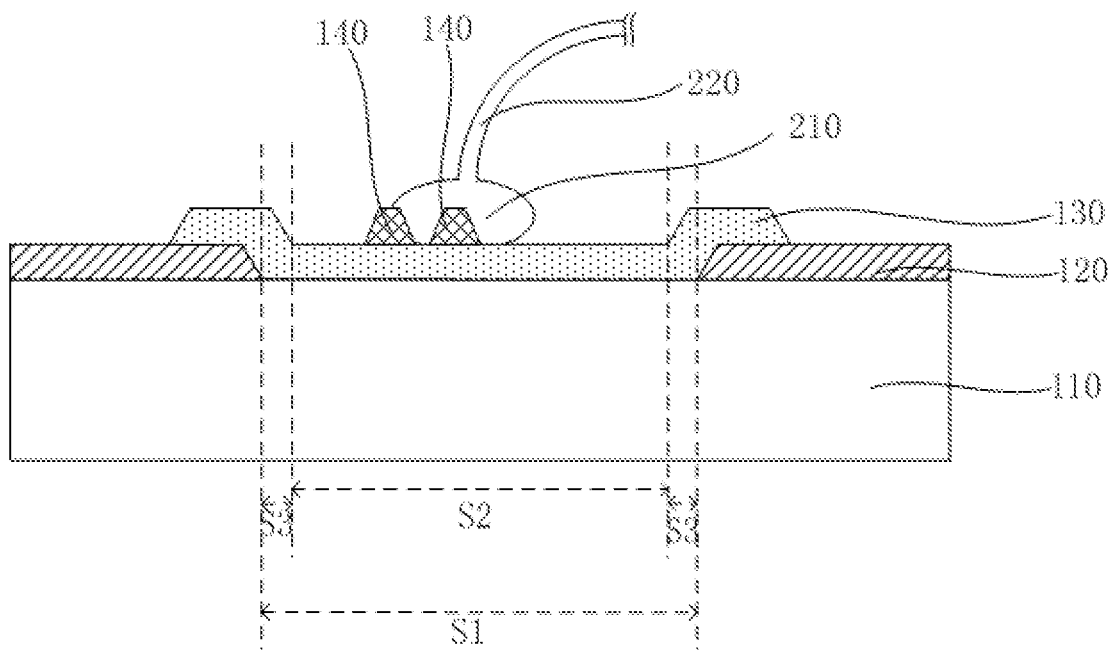
FIG. 3 illustrates a schematic diagram of another functional component consistent with various embodiments of the present disclosure.

FIG. 3 illustrates a schematic diagram of another functional component consistent with various embodiments of the present disclosure. In one embodiment, the packaging substrate includes a plurality of wire-bonding bump electrodes 140. The wire-bonding connection portion 210 may cover at least a partial area of the side of at least one wire-bonding bump electrode 140, and the wire-bonding connection portion 210 also covers an entire area of the at least one wire-bonding bump electrode 140.

Figure 4:
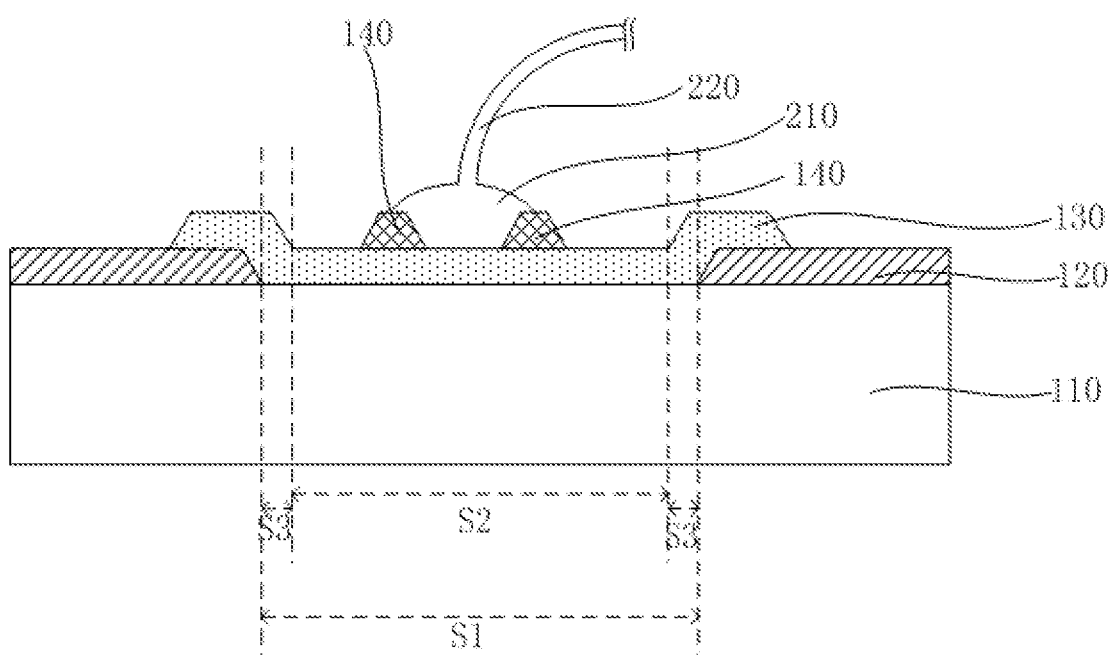
FIG. 4 illustrates a schematic diagram of another functional component consistent with various embodiments of the present disclosure.

FIG. 4 illustrates a schematic diagram of another functional component consistent with various embodiments of the present disclosure. In one embodiment, the packaging substrate includes a plurality of wire-bonding bump electrodes 140. The wire-bonding connection portion 210 may cover at least a partial area of sides of the plurality of wire-bonding bump electrodes 140.

Figure 5:
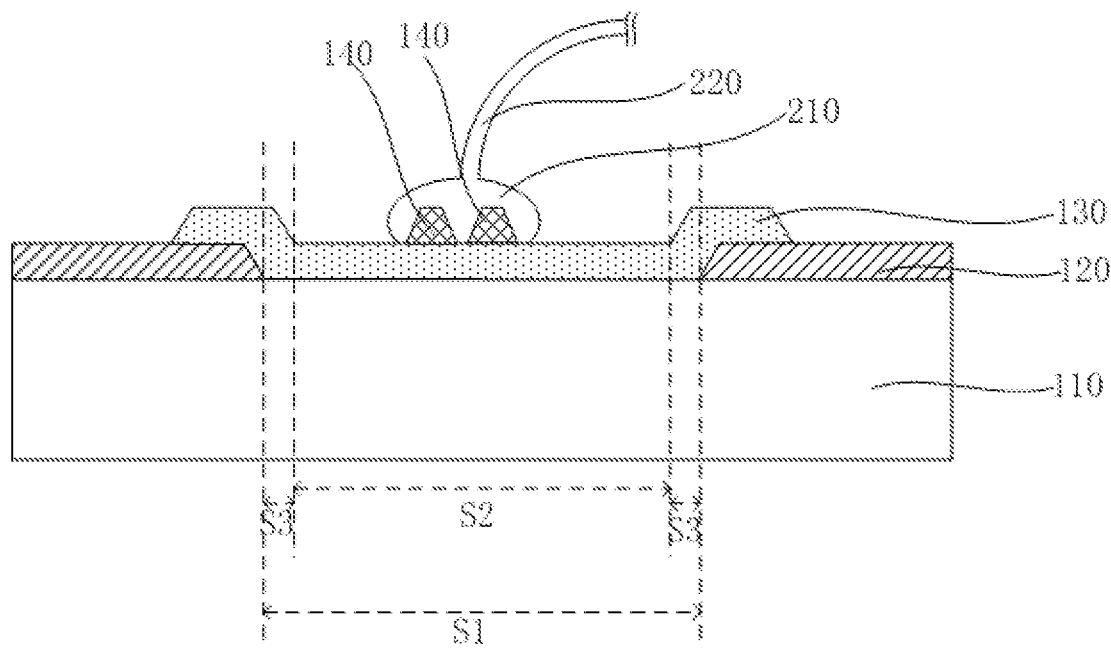
FIG. 5 illustrates a schematic diagram of another functional component consistent with various embodiments of the present disclosure.

FIG. 5 illustrates a schematic diagram of another functional component consistent with various embodiments of the present disclosure. In one embodiment, the packaging substrate includes a plurality of wire-bonding bump electrodes 140. The wire-bonding connection portion 210 may cover an entire area of the plurality of wire-bonding bump electrodes 140.

It should be noted that covering methods of the wire-bonding connection portion 210 and the wire-bonding bump electrodes 140 shown in FIGS. 1-5 are only a few of all applicable methods of the present disclosure, which are not specifically limited herein. Specific designs need to be carried out according to actual applications.

Figure 6:
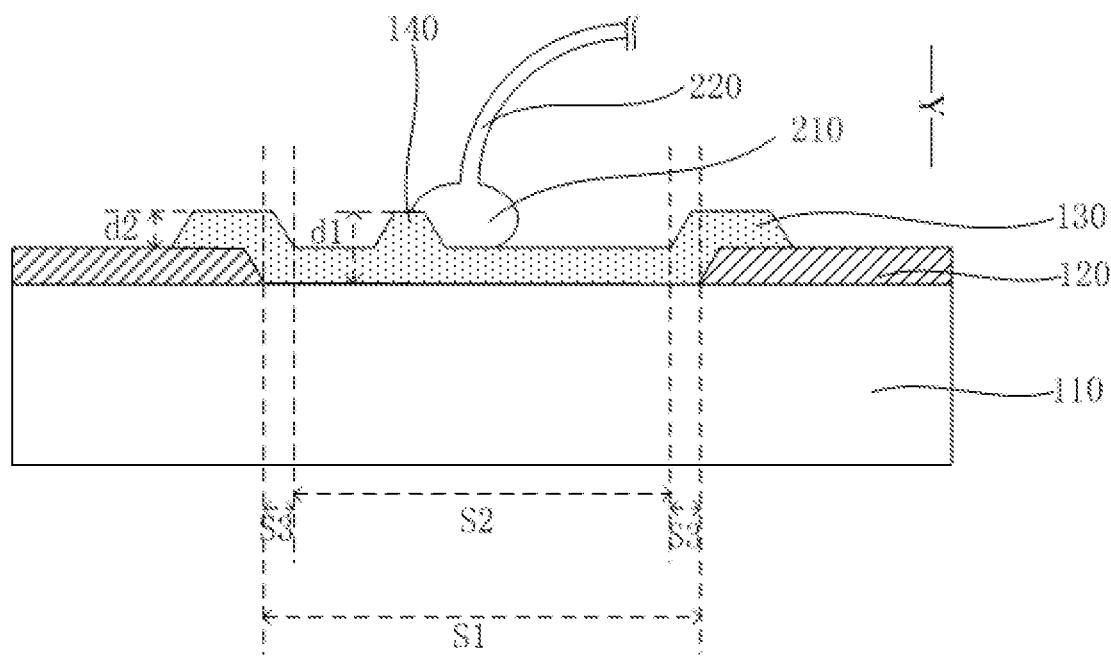
FIG. 6 illustrates a schematic diagram of another functional component consistent with various embodiments of the present disclosure.

In one embodiment, the wire-bonding bump electrodes can be integrated with the wire-bonding electrode. FIG. 6 illustrates a schematic diagram of another functional component consistent with various embodiments of the present disclosure. The wire-bonding bump electrodes 140 and the wire-bonding electrode 130 are integrally structured. In a direction Y perpendicular to a surface where the substrate 110 is located, a thickness d1 of the wire-bonding electrode 130 at the wire-bonding bump electrodes 140 is greater than a thickness d2 at other areas of the wire-bonding electrode 130. In the embodiment, the wire-bonding bump electrodes 140 and the wire-bonding electrode 130 are provided as an integrated structure, that is, when the wire-bonding electrode 130 is formed, a thickness of a specific area of the wire-bonding electrode 130 is increased to obtain the wire-bonding bump electrodes 140, thereby simplifying a forming process and reducing a forming difficulty.

Alternatively, the wire-bonding electrode and the wire-bonding bump electrodes are arranged on different electrode layers. Optionally, the electrodes can be formed by etching and other processes. That is, when forming the functional component, a first electrode layer where the wire-bonding electrode is located is firstly formed, etching and other processes are performed on the first electrode layer to obtain the wire-bonding electrode, a second electrode layer where the wire-bonding bump electrodes are located is formed, and the second electrode layer is subjected to processes such as etching to form the wire-bonding bump electrodes. Or the electrode can be formed by processes including coating. That is, when forming the functional component, the wire-bonding electrode is formed by coating and other processes, and the wire-bonding bump electrodes are formed by coating and other processes. Forming methods of the wire-bonding electrode and the wire-bonding bump electrodes are not specifically limited herein. The present disclosure arranges the wire-bonding electrode and the wire-bonding bump electrodes to be on different electrode layers, which can flexibly arrange a material of the wire-bonding bump electrodes to meet needs of different scenarios. Optionally, when the wire-bonding electrode and the wire-bonding bump electrodes are located on different electrode layers, materials of the wire bonding electrodes and the wire-bonding bump electrodes may be same or different conductive materials.

Figure 7:
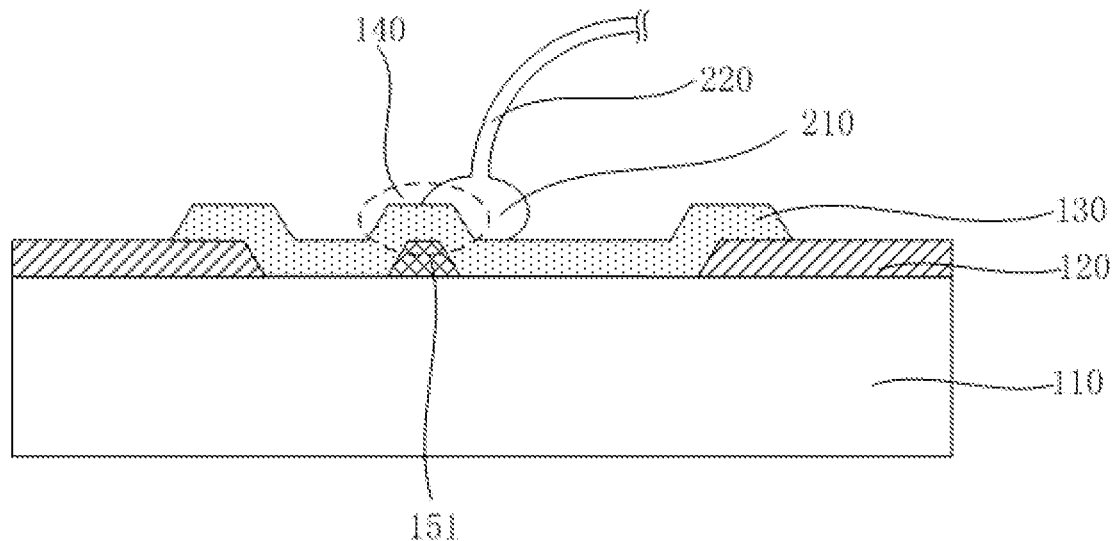
FIG. 7 illustrates a schematic diagram of another functional component consistent with various embodiments of the present disclosure.

In one embodiment, the wire-bonding bump electrodes may be formed after bumping the wire-bonding electrode. FIG. 7 illustrates a schematic diagram of another functional component consistent with various embodiments of the present disclosure. The packaging substrate includes first auxiliary bumps 151 between the wire-bonding electrode 130 and the substrate 110. The wire-bonding electrode 130 covers the wire-bonding bump electrodes 140 protruding at the first auxiliary bumps 151.

It can be understood that, in one embodiment, the wire-bonding electrode 130 is a film electrode with a uniform thickness. When the wire-bonding electrode 130 covers the first auxiliary bumps 151 during a forming process, the wire-bonding electrode 130 is in protruding structures at the first auxiliary bumps 151. That is, the protruding structures are wire-bonding bump electrodes 140.

Figure 8:
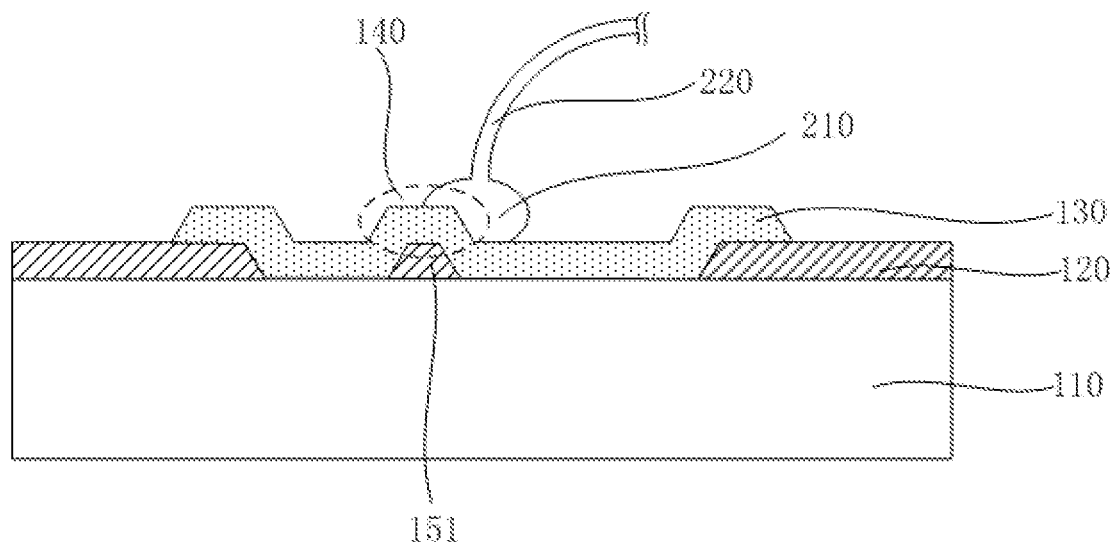
FIG. 8 illustrates a schematic diagram of another functional component consistent with various embodiments of the present disclosure.

FIG. 8 illustrates a schematic diagram of another functional component consistent with various embodiments of the present disclosure. In one embodiment, the first auxiliary bump 151 and the first insulating layer 120 are structures on a same layer. That is, the first auxiliary bump 151 reuses part of the first insulating layer 120 without separately forming a film layer to form the first auxiliary bump 151, which simplifies a forming process and avoids resource waste.

It should be noted that the first auxiliary bump can also be formed by a film layer independent of the first insulating layer, which needs to be specifically designed according to an actual application and is not specifically limited herein.

Figure 9:
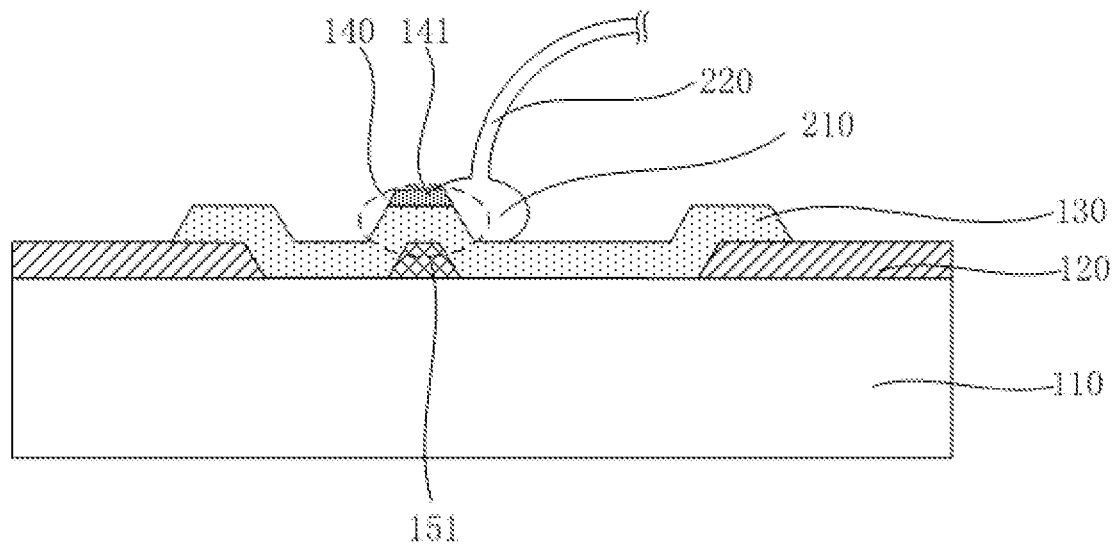
FIG. 9 illustrates a schematic diagram of another functional component consistent with various embodiments of the present disclosure.

Further, based on forming the wire-bonding bump electrodes by protruding the wire-bonding electrode, the wire-bonding bump electrodes may also include a first auxiliary bump electrode, that is, a wire-bonding bump electrode is formed by overlapping a bump of the wire-bonding electrode and the first auxiliary bump electrode. FIG. 9 illustrates a schematic diagram of another functional component consistent with various embodiments of the present disclosure. In one embodiment, the wire-bonding bump electrodes 140 further include a first auxiliary electrode 141 on the side of the wire-bonding electrode 130 away from the first insulating layer 120 and corresponding to the first auxiliary bump 151. Therefore, a protrusion degree of the wire-bonding bump electrodes 140 can be increased, an area of a side of the wire-bonding bump electrodes 140 can be increased, and a success rate of wire bonding between the wire-bonding bump electrodes 140 and the connecting wire can be further improved.

Figure 10:
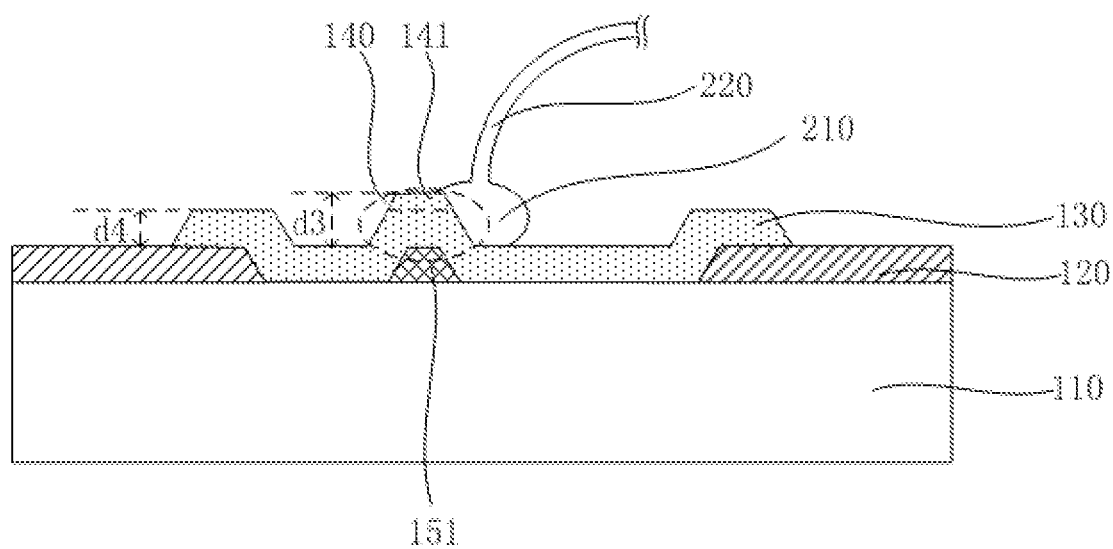
FIG. 10 illustrates a schematic diagram of another functional component consistent with various embodiments of the present disclosure.

FIG. 10 illustrates a schematic diagram of another functional component consistent with various embodiments of the present disclosure. In one embodiment, the first auxiliary electrode 141 is integrated with the wire-bonding electrode 130. In the direction Y perpendicular to a surface of the substrate 110, a thickness d3 of the wire-bonding electrode 130 at the first auxiliary electrode 141 is greater than a thickness d4 at other areas of the wire-bonding electrode 130. Therefore, the first auxiliary electrode 141 and the wire-bonding electrode 130 are arranged as an integrated structure, that is, when the wire-bonding electrode 130 is formed, the first auxiliary electrode 141 can be obtained by increasing a thickness of an specific area of the wire-bonding electrode 130, thereby simplifies a forming process and reduces a forming difficulty.

Alternatively, the wire-bonding electrode and the first auxiliary electrode are on different electrode layers. Optionally, the electrodes can be formed by etching and other processes. That is, when forming the functional component, a first electrode layer where the wire-bonded electrodes are located is formed. After performing etching and other processes on the first electrode layer to obtain the wire-bonded electrode, the second electrode layer where the first auxiliary electrodes are located is formed. After the second electrode layer is subjected to etching and other processes, the first auxiliary electrode is formed. Or the electrodes can be formed by coating and other processes. That is, when forming the functional component, the wire-bonding electrode is formed by coating and other processes, and the first auxiliary electrode is formed by coating and other processes. Forming methods of the wire-bonding electrode and the first auxiliary electrode are not specifically limited herein. Arranging the wire-bonding electrode and the first auxiliary electrode on different electrode layers can flexibly arrange a material of the first auxiliary electrode to meet needs of different scenarios. Optionally, when the wire-bonding electrode and the first auxiliary electrode are on different electrode layers, materials of the wire-bonding electrode and the first auxiliary electrode may be same or different.

Figure 11:
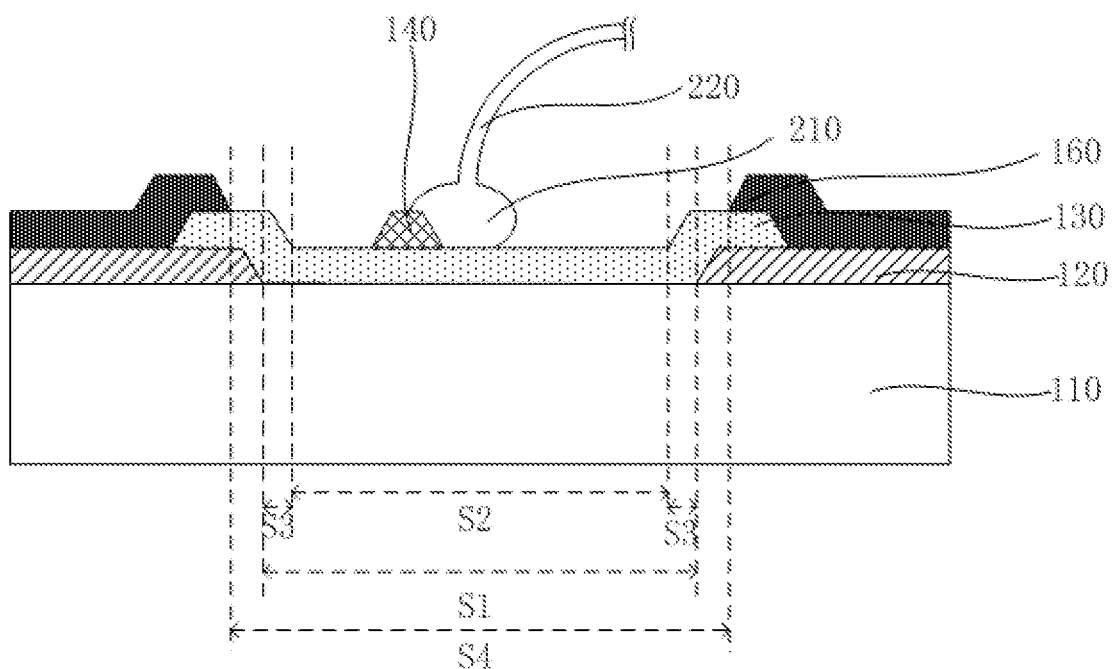
FIG. 11 illustrates a schematic diagram of another functional component consistent with various embodiments of the present disclosure.

In one embodiment, the packaging substrate may be a multi-layer packaging substrate. FIG. 11 illustrates a schematic diagram of another functional component consistent with various embodiments of the present disclosure. The packaging substrate further includes a second insulating layer 160 formed on a side of the wire-bonding electrode 130 away from the substrate 110. The second insulating layer 160 includes a second through hole S4 exposing at least a partial area of the wire-bonding electrode 130 corresponding to the first through hole S1. The second through hole S4 exposes the wire-bonding bump electrodes 140.

It can be understood that the packaging substrate also includes the second insulating layer 160 formed on the side of the wire-bonding electrode 130 away from the substrate 110, thereby facilitating forming more wires on a side of the second insulating layer 160 away from the substrate 110, which is not specifically limited herein. To ensure that the wire-bonding electrode 130 can be connected to the connecting wire, the second insulating layer 160 further includes the second through hole S4 exposing at least a partial area of the wire-bonding electrode 130. The second through hole S4 exposes the wire-bonding bump electrodes 140.

Figure 12:
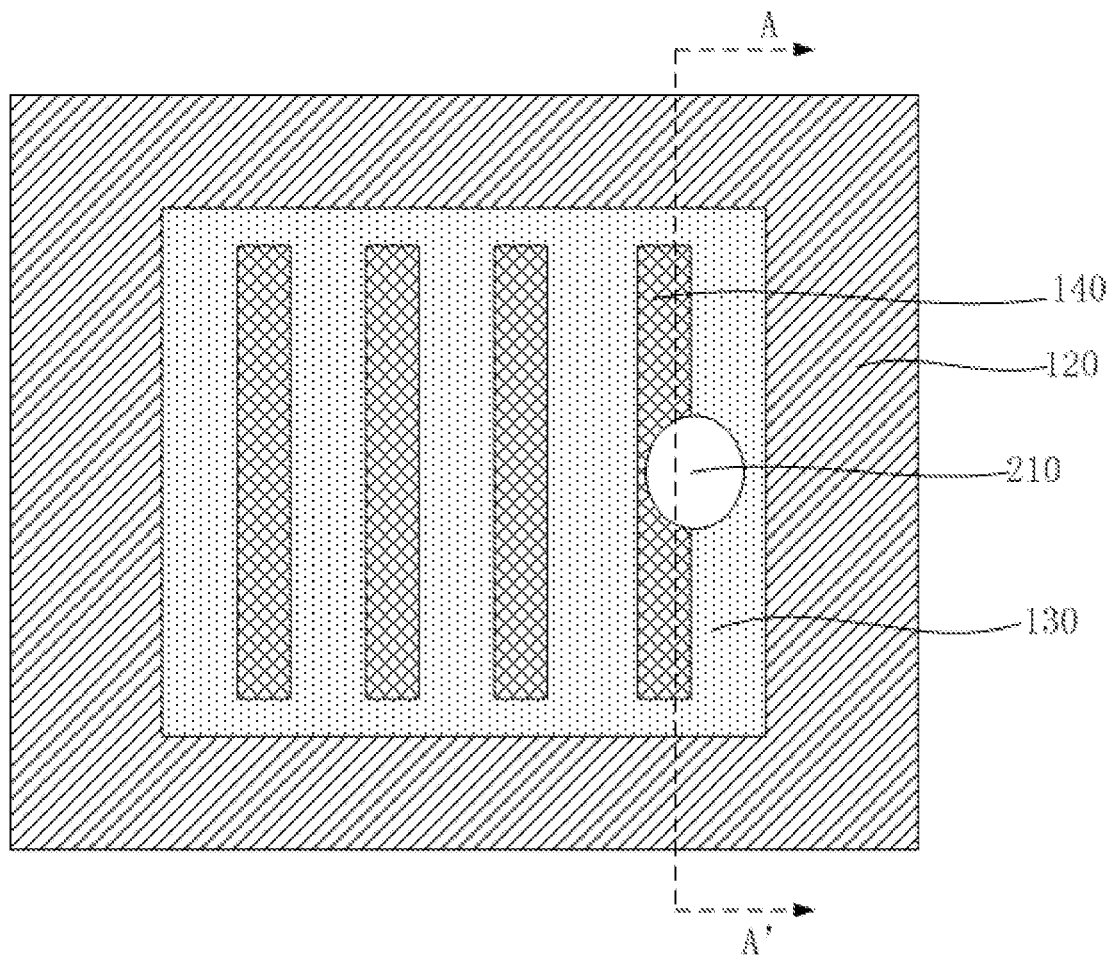
FIG. 12 illustrates a schematic diagram of another functional component consistent with various embodiments of the present disclosure.
Figure 13:
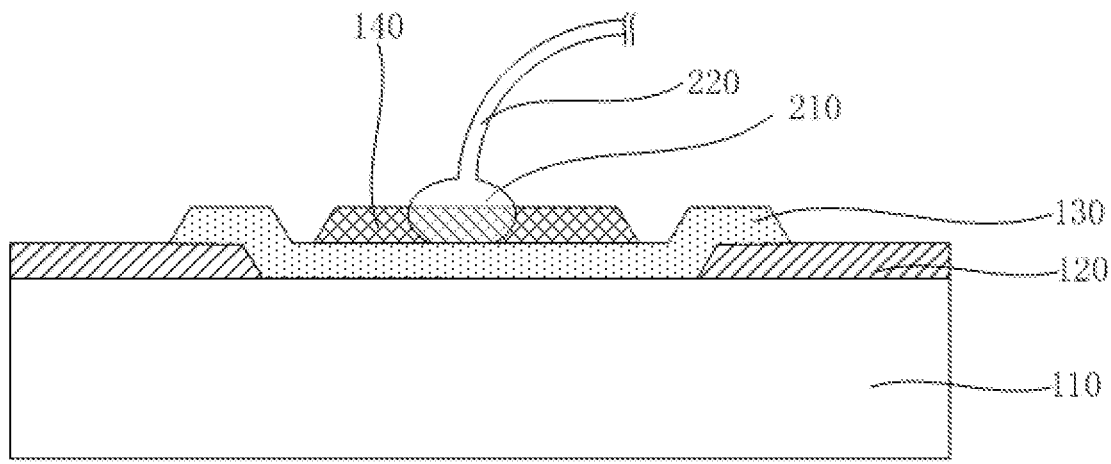
FIG. 13 illustrates a schematic diagram of another functional component consistent with various embodiments of the present disclosure.

FIG. 12 illustrates a schematic diagram of another functional component consistent with various embodiments of the present disclosure. FIG. 13 illustrates a sectional view along an AA' direction in FIG. 12. Referring to FIG. 12 and FIG. 13, in one embodiment, the wire-bonding bump electrodes 140 can be strip-shaped bumps. By arranging the wire-bonding bump electrodes 140 as strip-shaped bumps, an occupied area of the wire-bonding bump electrodes 140 is increased, and a difficulty in aligning the wire-bonding bump electrodes 140 and the wire-bonding connection portion 210 is reduced, thereby facilitating alignment, connection, and fixation of the wire-bonding bump electrodes 140 and the wire-bonding connection portion 210.

Figure 14:
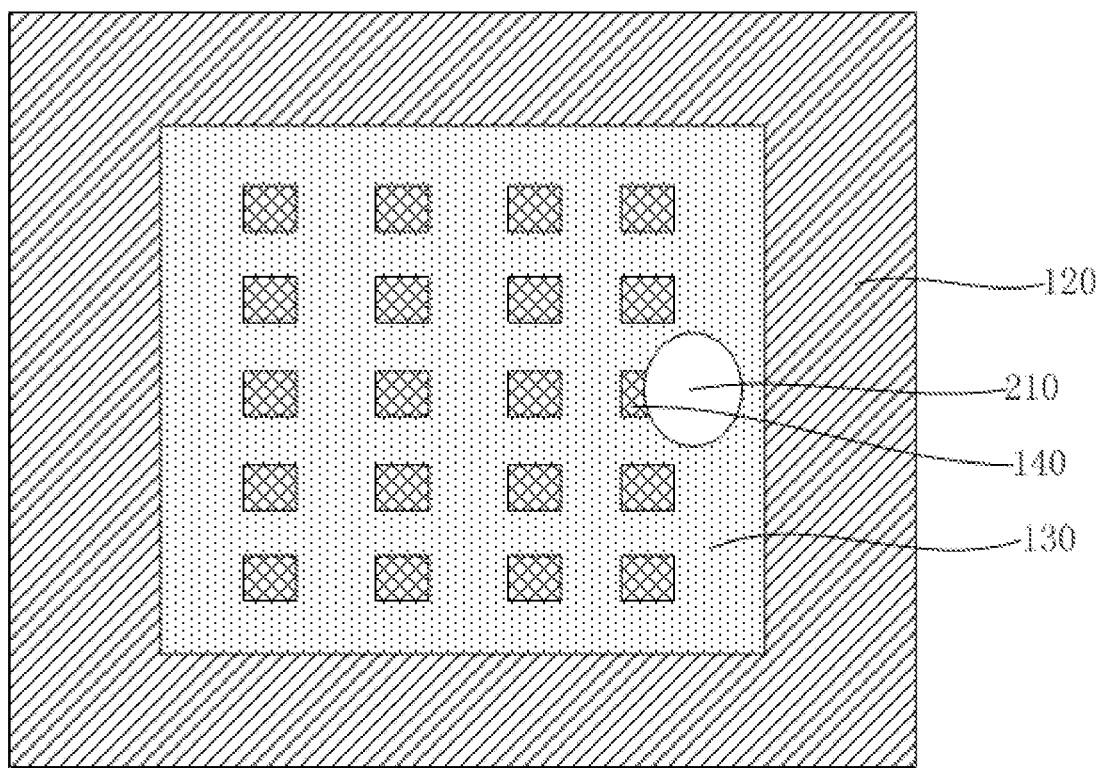
FIG. 14 illustrates a schematic diagram of another functional component consistent with various embodiments of the present disclosure.

FIG. 14 illustrates a schematic diagram of another functional component consistent with various embodiments of the present disclosure. Referring to FIG. 1, FIG. 5 and FIG. 14, in one embodiment, the wire-bonding bump electrodes 140 can also be island-shaped bumps, thereby reducing an occupied area of the wire-bonding bump electrodes 140. The wire-bonding connection portion 210 can better extend and cover at least a partial area of the wire-bonding bump electrodes 140. Moreover, the wire-bonding bump electrodes 140 are arranged as island-shaped bumps, thereby facilitating the wire-bonding connection portion 210 to cover more wire-bonding bump electrodes 140, improving a fixing strength between the wire-bonding connection portion 210 and the wire-bonding electrode 130, and improving an adhesion of the wire-bonding connection portion 210.

Figure 15:
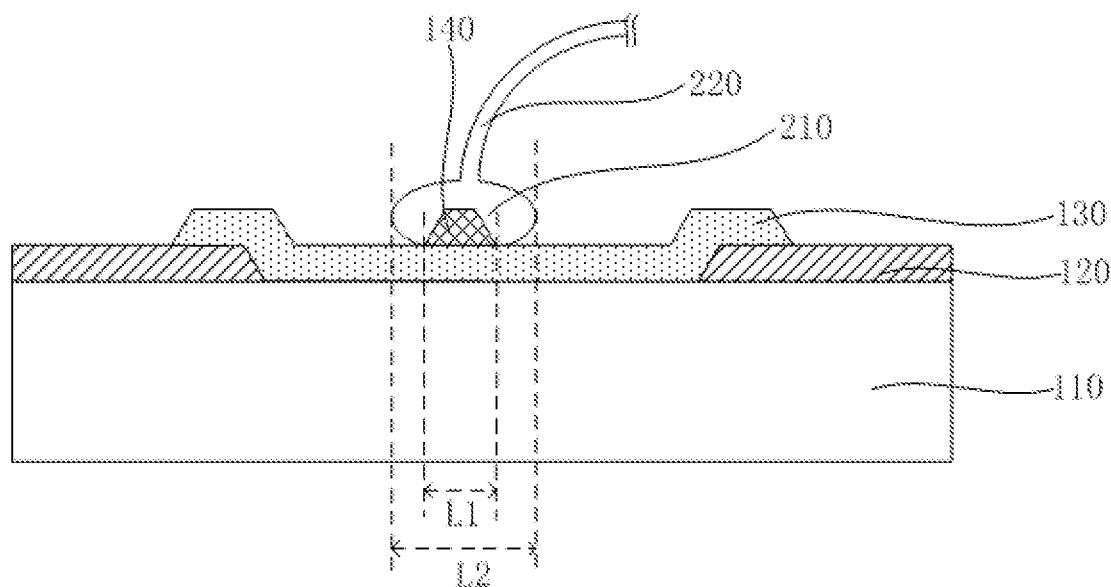
FIG. 15 illustrates a schematic diagram of another functional component consistent with various embodiments of the present disclosure.

FIG. 15 illustrates a schematic diagram of another functional component consistent with various embodiments of the present disclosure. In one embodiment, a size L1 of the wire-bonding bump electrodes 140 in at least one direction parallel to a surface where the wire-bonding electrode 130 is located is smaller than a maximum size L2 of the wire-bonding connection portion 210 in a direction parallel to the surface where the wire-bonding electrode 130 is located.

It can be understood that, in the embodiment, the size L1 of the wire-bonding bump electrodes 140 in at least one direction parallel to the surface where the wire-bonding electrode 130 is located is arranged to be smaller than the maximum size L2 of the wire-bonding connection portion 210 in a direction parallel to the surface where the wire bonding electrodes 130 are located. Therefore, at a position of the size L1 of the wire-bonding bump electrodes 140, a problem that an entire area of the wire-bonding connection portion 210 is fixed on a surface of the wire-bonding bump electrodes 140 facing away from the substrate 110 will not occur. Part of the wire-bonding connection portion 210 must have a partial area covering the wire-bonding bump electrodes 140, and another part of the wire-bonding connection portion 210 is fixedly connected to the wire-bonding electrode 130. That is, when the wire-bonding connection portion 210 and the wire-bonding electrode 130 are fixed, an alignment between the wire-bonding connection portion 210 and the wire-bonding bump electrodes 140 is more convenient, and the wire-bonding connection portion 210 is more conveniently extended to cover at least part of the wire-bonding bump electrodes 140, which reduces a forming difficulty. Optionally, the size L1 may be less than half of the size L2, which is not specifically limited herein.

Figure 16:
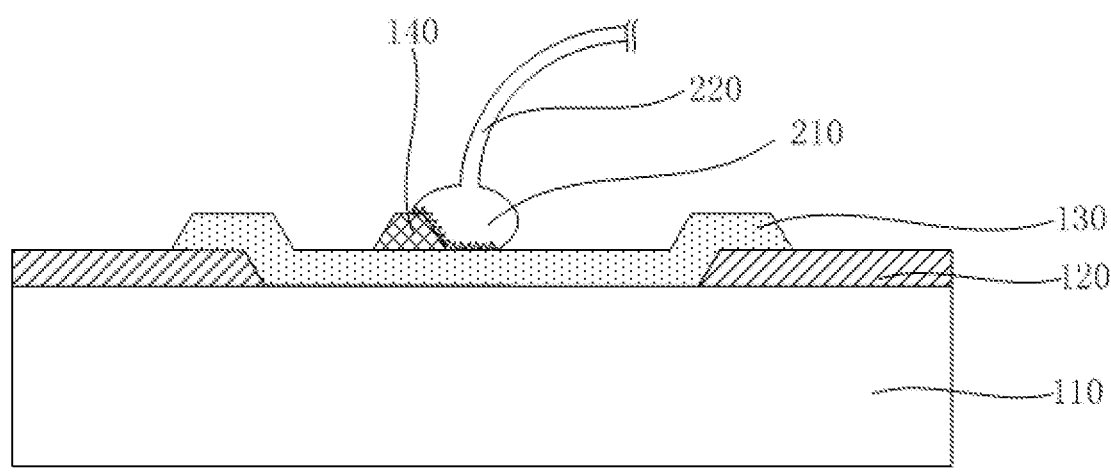
FIG. 16 illustrates a schematic diagram of another functional component consistent with various embodiments of the present disclosure.

FIG. 16 illustrates a schematic diagram of another functional component consistent with various embodiments of the present disclosure. In one embodiment, at a contact surface between the wire-bonding electrode 130 and the wire-bonding electrode 130 and contact surfaces between the wire-bonding bump electrodes 140 and the wire-bonding connection portion 210, the wire-bonding electrode 130 and/or the wire-bonding bump electrodes 140 are roughened surfaces, thereby improving a fixing strength between the wire-bonding connection portion 210 and the wire-bonding bump electrodes 140 and a fixing strength between the wire-bonding connection portion 210 and the wire-bonding electrode 130, and improving an adhesion of the wire-bonding connection portion 210.

Figure 17:
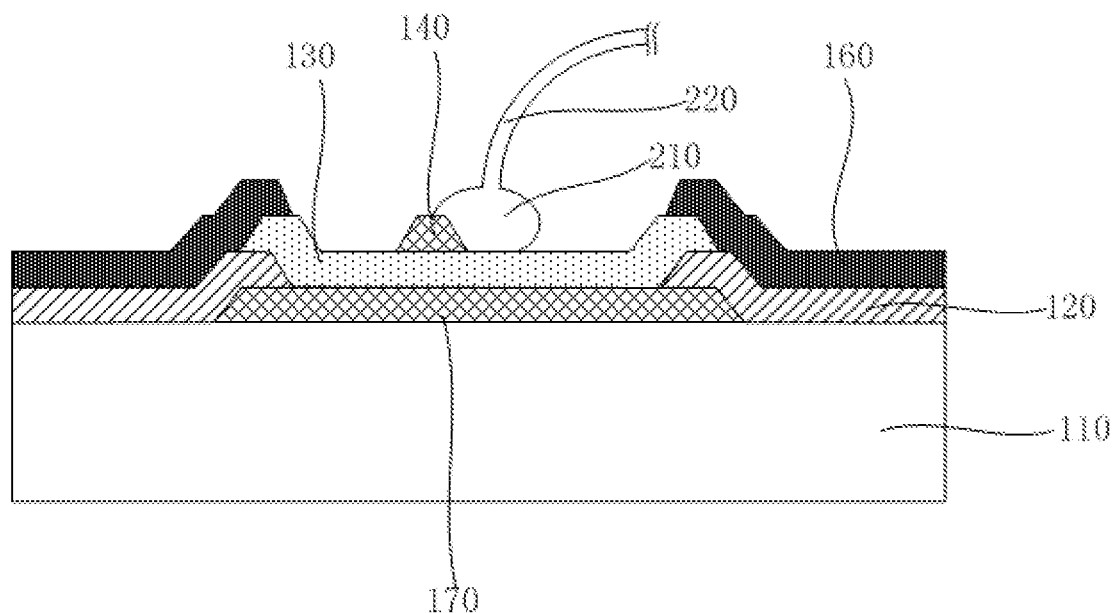
FIG. 17 illustrates a schematic diagram of another functional component consistent with various embodiments of the present disclosure.

In one embodiment, the packaging substrate may also include more electrode layers to improve a circuit integration of functional component and a performance of the functional component. That is, the packaging substrate further includes electrodes from a first electrode to an N-th electrode sequentially formed between the first insulating layer and the substrate. The N-th electrode is electrically connected to the wire-bonding electrode at a first through hole. N is an integer greater than or equal to 1. When N is greater than 1, an insulating layer is included between an i-th electrode and an (i+1)-th electrode, the insulating layer includes a through hole, and the i-th electrode is electrically connected to the i+1-th electrode at the through hole. i is an integer greater than or equal to 1 and less than N. In the following, a first electrode is included between the first insulating layer and the substrate as an example for illustration. FIG. 17 illustrates a schematic diagram of another functional component consistent with various embodiments of the present disclosure. In one embodiment, a first electrode 170 is also included between the first insulating layer 120 and the substrate 110. The first electrode 170 is in contact with the wire-bonding electrode 130 at the first through hole, and an electrode layer where the first electrode 170 is located and an electrode layer where the wire-bonding electrode 130 is located are insulated and isolated by the first insulating layer 120. The packaging substrate is constructed with more electrode layers, so that more functional circuits can be formed on the packaging substrate, thereby improving a circuit integration and a performance of the functional component.

In any one of the above embodiments, the wire-bonding electrode may be an aluminum wire-bonding electrode. It can be understood that aluminum has excellent electrical properties, so a use of aluminum electrodes for wire-bonding electrode can not only improve an electrode performance, but also reduce costs. However, aluminum is a metal that is relatively easy to oxidize, and an aluminum surface cannot be plated with gold-containing substances. When the wire-bonding connection portion is fixed to an aluminum electrode by wire bonding, it is prone to wire bonding failure. Therefore, the embodiments of the present disclosure can improve a success rate of wire bonding of the connecting wire and the wire-bonding electrode by forming wire-bonding bump electrodes on the wire-bonding electrode and solve a high failure rate of wire bonding in the industry. The connecting wire can be a gold connecting wire, which is not specifically limited herein.

Materials of the first insulating layer, the second insulating layer and the insulating layer between the electrodes can be silicon nitride, which is not specifically limited herein.

Figure 18:
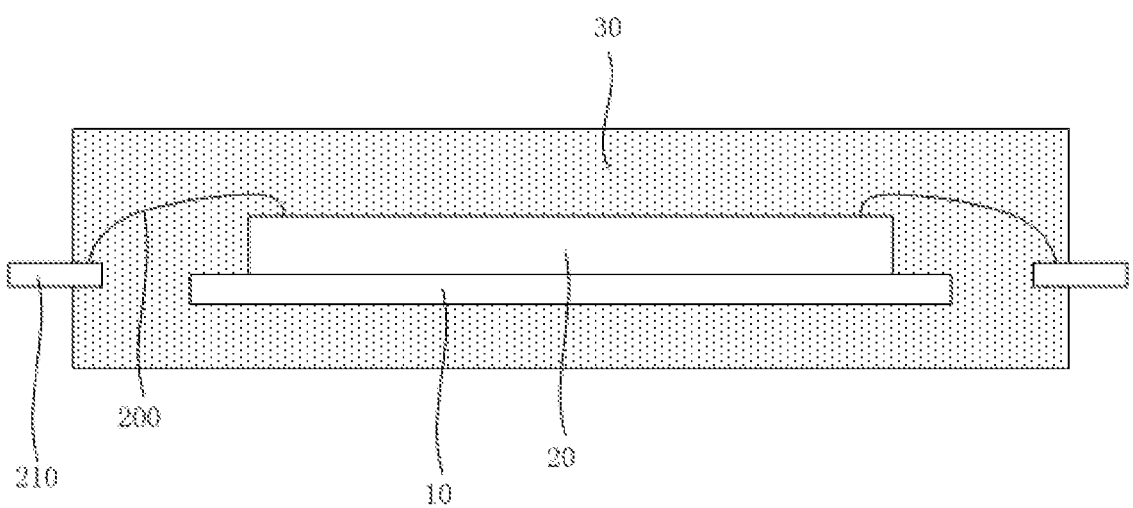
FIG. 18 illustrates a schematic diagram of another functional component consistent with various embodiments of the present disclosure.

FIG. 18 illustrates a schematic diagram of another functional component consistent with various embodiments of the present disclosure. In one embodiment, the functional component may be a packaged component. The functional component includes a carrier stage 10 and a chip 20 on the carrier stage 10. The chip 20 includes the through-hole wire-bonding area provided by any one of the above embodiments. The wire-bonding electrode and the wire-bonding bump electrodes in the through hole bonding area are bonded with the connecting wire 200, so that the wire-bonding electrode is connected to pins 210. The chip 20 is encapsulated by a plastic package 30. Part of the pin 210 is exposed outside the plastic package 30, so that the chip 20 is electrically connected to other electrical components.

Accordingly, one embodiment further provides an electronic device, where the electronic device includes a functional component provided by any one of the above embodiments.

Figure 19:
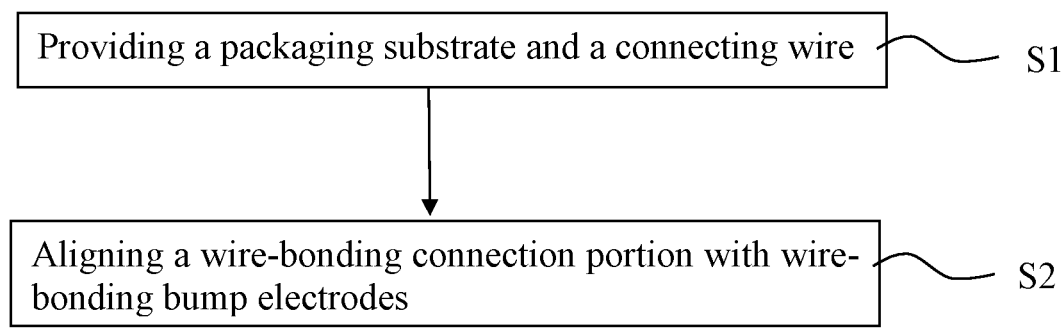
FIG. 19 illustrates a flow chart of a forming method of a functional component consistent with various embodiments of the present disclosure.

Accordingly, one embodiment also provides a forming method of a functional component, which is used to form the functional component provided by any one of the above embodiments. FIG. 19 illustrates a flow chart of a forming method of a functional component consistent with various embodiments of the present disclosure. The forming method includes the following steps.

S1: Providing a packaging substrate and a connecting wire.

Specifically, the packaging substrate includes a through-hole wire-bonding area, and the through-hole wire-bonding area includes a first insulating layer and a wire-bonding electrode sequentially formed on the substrate. The first insulating layer includes a first through hole, and the wire-bonding electrode covers the first through hole. In an area corresponding to the first through hole, the packaging substrate has wire-bonding bump electrodes on the side of the wire-bonding electrode away from the first insulating layer. The connecting wire includes a wire-bonding connection portion and a wire-bonding extension portion connected to the wire-bonding connection portion.

For example, the structure provided by the embodiment of the present disclosure may be a packaged device with a chip. After the bare chip is packaged, it is necessary to increase the distance between the interfaces of the chip through rewiring, and at the same time increase the connection port.

S2: aligning the wire-bonding connection portion with the wire-bonding bump electrodes and performing a wire-bonding.

The wire-bonding connection portion is fixedly connected to the wire-bonding electrode, and the wire-bonding connection portion covers at least a partial area of at least one of the wire-bonding bump electrodes.

For example, the functional component can be a packaged component with a chip, which is connected to other electrical components through wire bonds.

It can be understood that a wire bonding process provided by the embodiments of the present disclosure is mainly a process of pressure-welding the connecting wire. A front section of the connecting wire is sintered to form a wire-bonding connection portion, and a general wire-bonding connection portion is spherical. The wire-bonding connection portion is aligned with the wire-bonding electrode and the wire-bonding bump electrodes. Based on ensuring that the wire-bonding connection portion and the wire-bonding electrode are fixed, the wire-bonding connection portion also extends to cover at least a partial area of the wire-bonding bump electrodes, thereby completing the wire-bonding process.

As disclosed, the functional component, forming method thereof, and electronic device provided by the present disclosure at least realize the following beneficial effects.

The functional component includes a packaging substrate and a connecting wire. The packaging substrate includes a through-hole wire-bonding area, and the through-hole wire-bonding area includes a first insulating layer and a wire-bonding electrode sequentially formed on the substrate. The first insulating layer includes a first through hole and punching a wire-bonding electrode covering the first through hole. In an area corresponding to the first through hole, the packaging substrate has wire-bonding bump electrodes on the side of the wire-bonding electrode away from the first insulating layer. The connecting wire includes a wire-bonding connection portion and a wire-bonding extension portion connected to the wire-bonding connection portion. The wire-bonding connection portion is fixedly connected to the wire-bonding electrode, and the wire-bonding connection portion covers at least a partial area of at least one of the wire-bonding bump electrodes.

In an area corresponding to the first through hole, the packaging substrate has wire-bonding bump electrodes on a side where the wire-bonding electrode away from the first insulating layer, so that the wire-bonding connection portion of the connecting wire is fixedly connected to the wire-bonding electrode at the wire-bonding bump electrode, and the wire-bonding connection portion covers at least a partial area of at least one wire-bonding bump electrode, which can ensure a successful wire bonding between the wire-bonding electrode and the connecting wire. The wire-bonding electrode and connecting wire can be successfully bonded in the area corresponding to the first through hole, which not only improves the success rate of wire bonding, but also improves a flexibility of wire bonding in a forming process of the functional component.

In describing the present disclosure, it is to be understood that terms "central", "longitudinal", "transverse", "length", "width", "thickness", "upper", "lower", "front", "back", "left", "right", "vertical", "horizontal", "top", "bottom", "inner", "outer", "clockwise", "counterclockwise", "axial", "radial", "circumferential", and the like indicate orientation or positional relationships based on the orientation or positional relationship shown in the accompanying drawings, and are only for the convenience of describing the present disclosure and simplifying descriptions, rather than indicating or implying that the device or element referred to must have a specific orientation, be constructed and operated in a specific orientation, and therefore should not be construed as limiting the present disclosure.

In addition, terms such as "first" and "second" are used for descriptive purposes only and cannot be understood as indicating or implying relative importance or implicitly specifying the quantity of indicated technical features. Therefore, features defined as "first" and "second" may explicitly or implicitly include at least one of the features. In the description of the present disclosure, "plurality" means at least two, such as two or three, unless specifically defined otherwise.

In the present disclosure, unless otherwise clearly specified and limited, terms such as "installation", "connection", "fixation" and other terms should be understood in a broad sense, such as a fixed connection or a fixed connection. disassembled connection, or integrated connection. The connection can be mechanically connected, or electrically connected, or can communicate with each other. The connection can be directly connected, or indirectly connected through an intermediate medium. The connection can be an internal communication of two elements or an interaction relationship between two elements, unless otherwise expressly stated limited. A person skilled in the art can understand specific meanings of the above terms in the present disclosure according to specific circumstances.

In the present disclosure, unless otherwise clearly specified and limited, a first feature being "on" or "under" a second feature may be that the first and second features are in direct contact, or that the first and second features are in indirect contact through an intermediary. Moreover, the first feature being "above" the second feature may mean that the first feature is directly above or obliquely above the second feature, or simply means that the first feature is higher in level than the second feature. The first feature being "under", "below" and "beneath" the second feature may mean that the first feature is directly below or obliquely below the second feature, or simply means that the first feature is less horizontally than the second feature.

In the present disclosure, terms "one embodiment", "some embodiments", "example", "specific examples", "some examples", and the like mean that a specific feature, structure, material, or characteristic described in connection with the embodiment or example is included in at least one embodiment or example of the present disclosure. In the present specification, schematic representations of the above terms are not necessarily directed to a same embodiment or example. Furthermore, the described specific features, structures, materials, or characteristics may be combined in any suitable manner in any one or more embodiments or examples. In addition, a person skilled in the art can combine and combine different embodiments or examples and features of different embodiments or examples described in the present specification without conflicting with each other.

Although the embodiments of the present disclosure have been illustrated and described above, it can be understood that the above embodiments are exemplary and should not be construed as limitations of the present disclosure. A person skilled in the art can make changes, modifications, substitutions, and variations to the above embodiments within the scope of the present disclosure.

What is claimed is:

1. A functional component, comprising a packaging substrate and a connecting wire, wherein:
    the packaging substrate includes a through-hole wire-bonding area that includes a first insulating layer and a wire-bonding electrode sequentially formed on the substrate, the first insulating layer includes a first through hole, the wire-bonding electrode covers the first through hole, and in an area corresponding to the first through hole, the packaging substrate has wire-bonding bump electrodes on a side of the wire-bonding electrode away from the first insulating layer; and
    the connecting wire includes a wire-bonding connection portion and a wire-bonding extension portion connected to the wire-bonding connection portion, the wire-bonding connection portion is fixedly connected to the wire-bonding electrode, and the wire-bonding connection portion extends to cover at least a partial area of a side of at least one of the wire-bonding bump electrodes.

2. The functional component according to claim 1, wherein the wire-bonding electrode is an aluminum wire-bonding electrode.

3. The functional component according to claim 1, wherein the connecting wire is a gold connecting wire.

4. The functional component according to claim 1, wherein:
    the wire-bonding bump electrodes are integrally structured with the wire-bonding electrode, in a direction perpendicular to a surface where the substrate is located, a thickness of the wire-bonding electrode at the wire-bonding bump electrodes is greater than a thickness of the wire-bonding electrode at other areas of the wire-bonding electrode; or
    the wire-bonding electrode and the wire-bonding bump electrodes are on different electrode layers.

5. The functional component according to claim 4, wherein materials of the wire-bonding electrode and the wire-bonding bump electrodes are same or different when the wire-bonding electrode and the wire-bonding bump electrodes are on different electrode layers.

6. The functional component according to claim 1, wherein the packaging substrate includes first auxiliary bumps between the wire-bonding electrode and the substrate, and the wire-bonding electrode covers the wire-bonding bump electrodes protruding at the first auxiliary bumps.

7. The functional component according to claim 6, wherein the first auxiliary bump and the first insulating layer are structures on a same layer.

8. The functional component according to claim 6, wherein the wire-bonding bump electrodes further include a first auxiliary electrode on the side of the wire-bonding electrode away from the first insulating layer and corresponding to the first auxiliary bump.

9. The functional component according to claim 8, wherein:
the first auxiliary electrode and the wire-bonding electrode are an integral structure, in a direction perpendicular to a surface where the substrate is located, a thickness of the wire-bonding electrode at the first auxiliary electrode is greater than a thickness of the wire-bonding electrode; or
the wire-bonding electrode and the first auxiliary electrode are on different electrode layers.

10. The functional component according to claim 1, wherein:
the packaging substrate further includes a second insulating layer formed on a side of the wire-bonding electrode away from the substrate; and
the second insulating layer includes a second through hole exposing at least a partial area of the wire-bonding electrode corresponding to the first through hole and exposing the wire-bonding bump electrodes.

11. The functional component according to claim 1, wherein the wire-bonding bump electrodes are strip-shaped bumps or island-shaped bumps.

12. The functional component according to claim 1, wherein:
the packaging substrate further includes electrodes from a first electrode to an N-th electrode sequentially formed between the first insulating layer and the substrate, and the N-th electrode is electrically connected to the wire-bonding electrode at the first through hole, and N is an integer greater than or equal to 1; and
when N is greater than 1, an insulating layer is included between the i-th electrode and the (i+1)-th electrode, the insulating layer includes a through hole, and i-th electrode is electrically connected to the (i+1)-th electrode at the through hole, and i is an integer greater than or equal to 1 and less than N.

13. The functional component according to claim 11, wherein a size of the wire-bonding bump electrodes in at least one direction parallel to a surface where the wire-bonding electrode is located is smaller than a maximum size of the wire-bonding connection portion in a direction parallel to the surface where the wire-bonding electrode is located.

14. The functional component according to claim 1, wherein at a contact surface between the wire-bonding electrode and the wire-bonding connection portion and contact surfaces between the wire-bonding bump electrodes and the wire-bonding connection portion, the wire-bonding electrode and/or the wire-bonding bump electrodes are roughened surfaces.

15. An electronic device, comprising a functional component comprising a packaging substrate and a connecting wire, wherein:
the packaging substrate includes a through-hole wire-bonding area including a first insulating layer and a wire-bonding electrode sequentially formed on the substrate, the first insulating layer includes a first through hole, and the wire-bonding electrode covers the first through hole, and in an area corresponding to the first through hole, the packaging substrate has wire-bonding bump electrodes on a side of the wire-bonding electrode away from the first insulating layer; and
the connecting wire includes a wire-bonding connection portion and a wire-bonding extension portion connected to the wire-bonding connection portion, the wire-bonding connection portion is fixedly connected to the wire-bonding electrode, and the wire-bonding connection portion extends to cover at least a partial area of a side of at least one of the wire-bonding bump electrodes.

16. A forming method of a functional component, comprising:
providing a packaging substrate and a connecting wire, wherein the packaging substrate includes a through-hole wire-bonding area that includes a first insulating layer and a wire-bonding electrode sequentially formed on the substrate, the first insulating layer includes a first through hole, the wire-bonding electrode covers the first through hole, in an area corresponding to the first through hole, the packaging substrate has wire-bonding bump electrodes on a side of the wire-bonding electrode away from the first insulating layer, and the connecting wire includes a wire-bonding connection portion and a wire-bonding extension portion connected to the wire-bonding connection portion; and
aligning the wire-bonding connection portion with the wire-bonding bump electrodes, wherein the wire-bonding connection portion is fixedly connected to the wire-bonding electrode, and the wire-bonding connection portion extends to cover at least a partial area of a side of at least one of the wire-bonding bump electrodes.

* * * * *